(12) United States Patent
Helfman

(10) Patent No.: US 10,429,437 B2
(45) Date of Patent: Oct. 1, 2019

(54) AUTOMATICALLY GENERATED TEST DIAGRAM

(71) Applicant: Keysight Technologies, Inc., Minneapolis, MN (US)

(72) Inventor: Jonathan Helfman, Half Moon Bay, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 423 days.

(21) Appl. No.: 14/724,347

(22) Filed: May 28, 2015

(65) Prior Publication Data

US 2016/0349312 A1   Dec. 1, 2016

(51) Int. Cl.
*G01R 31/28* (2006.01)
*G01R 35/00* (2006.01)

(52) U.S. Cl.
CPC ....... *G01R 31/2834* (2013.01); *G01R 35/005* (2013.01)

(58) Field of Classification Search
CPC .......................... G06F 11/263; G05B 23/0283
USPC .................................................. 702/123, 183
See application file for complete search history.

(56) References Cited

U.S. PATENT DOCUMENTS

| | | | | |
|---|---|---|---|---|
| 4,348,636 A | * | 9/1982 | Doundoulakis | G01R 31/319 324/537 |
| 5,500,934 A | * | 3/1996 | Austin | G06F 3/0481 715/835 |
| 5,535,330 A | * | 7/1996 | Bell | G01R 31/2803 714/36 |
| 5,606,664 A | * | 2/1997 | Brown | H04L 41/12 340/2.7 |
| 5,793,366 A | * | 8/1998 | Mano | H04L 12/40078 348/E5.103 |
| 5,917,808 A | * | 6/1999 | Kosbab | H04L 43/045 370/245 |
| 5,974,572 A | * | 10/1999 | Weinberg | G06F 11/32 707/E17.116 |
| 5,991,537 A | * | 11/1999 | McKeon | G06F 8/71 717/115 |
| 6,002,992 A | * | 12/1999 | Pauwels | G06F 11/3696 702/123 |
| 6,112,015 A | * | 8/2000 | Planas | H04L 41/22 709/220 |
| 6,137,295 A | * | 10/2000 | Yoshida | G01R 31/307 250/310 |

(Continued)

*Primary Examiner* — Michael T Tran

(57) ABSTRACT

A method of operating a data processing system to generate a diagram indicative of an experimental setup includes a device to be tested (DUT) and a plurality of test instruments is disclosed. The method includes detecting a first test instrument that is connected to the data processing system and determining connection points to the first test instrument. A script that specifies tests for the DUT using the plurality of test instruments and includes instructions specifying measurements to be made by the first test instrument is examined. A first connection between the DUT and the first test instrument is determined. An initial diagram on a display controlled by the data processing system is generated. The initial diagram includes a first node representing the first test instrument, a second node representing the DUT and a line representing the first connection between the first and second nodes.

16 Claims, 7 Drawing Sheets

(56) References Cited

U.S. PATENT DOCUMENTS

| | | | | |
|---|---|---|---|---|
| 6,418,391 | B1* | 7/2002 | Umezu | G01R 19/2516 702/119 |
| 6,421,069 | B1* | 7/2002 | Ludtke | G06F 9/4415 715/762 |
| 6,463,552 | B1* | 10/2002 | Jibbe | G06F 9/45512 714/33 |
| 6,529,951 | B1* | 3/2003 | Okuyama | H04L 12/40013 370/257 |
| 6,594,599 | B1* | 7/2003 | Kent | G01R 31/31728 702/84 |
| 6,784,902 | B1* | 8/2004 | Melder | G06F 8/34 715/771 |
| 6,957,396 | B2* | 10/2005 | Iwamura | H04N 5/44513 348/E5.102 |
| 6,988,229 | B1* | 1/2006 | Folea, Jr. | G01R 31/318591 324/762.02 |
| 7,284,177 | B2* | 10/2007 | Hollander | G01R 31/31704 714/739 |
| 7,363,188 | B1* | 4/2008 | Olgaard | G01R 31/31707 702/122 |
| 7,486,205 | B2* | 2/2009 | Wegener | G01R 31/31921 341/50 |
| 7,528,623 | B2* | 5/2009 | Zellner | G01R 31/02 324/760.01 |
| 7,552,024 | B2 | 6/2009 | Kelbon | |
| 7,606,909 | B1* | 10/2009 | Ely | G06Q 10/02 379/93.09 |
| 7,613,594 | B2* | 11/2009 | Lechine | G06F 17/50 345/419 |
| 7,627,790 | B2* | 12/2009 | Frisch | G01R 31/31709 327/161 |
| 7,631,237 | B2* | 12/2009 | Kiryu | G01R 31/318547 714/726 |
| 7,636,622 | B2* | 12/2009 | Underdal | G07C 5/08 701/29.1 |
| 7,680,621 | B2 | 3/2010 | Hayes | |
| 7,768,278 | B2* | 8/2010 | Mayder | G01R 31/31928 324/754.03 |
| 7,810,001 | B2* | 10/2010 | Zhou | G01R 31/31907 714/724 |
| 7,853,931 | B2* | 12/2010 | Srinivasamurthy | G06Q 10/06 717/105 |
| 7,930,130 | B2* | 4/2011 | Sakarovitch | G05B 13/024 702/123 |
| 7,950,004 | B2* | 5/2011 | Vieira | G06F 11/3688 714/25 |
| 7,970,594 | B2* | 6/2011 | Gaudette | G06F 17/5022 703/13 |
| 8,527,231 | B2* | 9/2013 | Luce | G01R 31/316 324/73.1 |
| 8,626,913 | B1* | 1/2014 | Chourey | G06Q 30/02 709/206 |
| 8,718,967 | B2* | 5/2014 | Filler | G06F 11/263 702/119 |
| 8,782,581 | B2* | 7/2014 | Agarwala | G06F 17/5022 716/104 |
| 8,793,646 | B2* | 7/2014 | Chancey | G06F 8/10 717/104 |
| 8,805,767 | B1* | 8/2014 | Wang | G06N 20/00 706/47 |
| 8,837,294 | B2* | 9/2014 | Frishberg | H04L 43/045 370/241 |
| 9,154,241 | B2* | 10/2015 | Luong | H04B 17/104 |
| 9,285,427 | B2* | 3/2016 | Luo | G01R 31/318536 |
| 9,400,301 | B2* | 7/2016 | Kanne | G01R 31/021 |
| 9,485,038 | B2* | 11/2016 | Olgaard | H04B 17/15 |
| 9,549,053 | B2* | 1/2017 | Voona | H04M 1/24 |
| 9,606,183 | B2* | 3/2017 | Moon | G01R 31/31907 |
| 9,641,419 | B2* | 5/2017 | Gintis | H04L 43/0811 |
| 9,712,406 | B2* | 7/2017 | Chu | H04L 43/065 |
| 9,741,256 | B2* | 8/2017 | Akopian | G09B 5/00 |
| 9,952,276 | B2* | 4/2018 | Frediani | G01R 31/2834 |
| 9,959,186 | B2* | 5/2018 | Hutner | G06F 11/2733 |
| 2002/0038439 | A1* | 3/2002 | Sato | G01R 31/31813 714/724 |
| 2002/0130836 | A1* | 9/2002 | Ohmori | G06F 1/1616 345/156 |
| 2002/0131052 | A1* | 9/2002 | Emery | G01N 21/95607 356/511 |
| 2002/0143486 | A1* | 10/2002 | Jain | G01R 31/319 702/117 |
| 2003/0036866 | A1* | 2/2003 | Nair | G01N 21/95 702/81 |
| 2003/0083831 | A1* | 5/2003 | Agrawal | G06F 7/50 702/65 |
| 2003/0212523 | A1* | 11/2003 | Dorough | G01R 31/2831 702/119 |
| 2003/0221149 | A1* | 11/2003 | Vollrath | G01R 31/3004 714/724 |
| 2003/0234652 | A1* | 12/2003 | Bald | G01R 35/00 324/551 |
| 2004/0021452 | A1* | 2/2004 | Hwang | G01R 31/041 324/66 |
| 2004/0024656 | A1* | 2/2004 | Coleman | G06Q 30/06 705/26.61 |
| 2004/0093516 | A1* | 5/2004 | Hornbeek | H04L 63/10 726/7 |
| 2004/0100468 | A1* | 5/2004 | Tenten | G01R 31/318307 345/440 |
| 2005/0005262 | A1* | 1/2005 | Mohan | G06F 8/20 717/109 |
| 2005/0039161 | A1* | 2/2005 | Pfander | G06F 9/541 717/105 |
| 2005/0183098 | A1* | 8/2005 | Ilic | G05B 19/042 719/328 |
| 2005/0232256 | A1* | 10/2005 | White | H04L 43/50 370/360 |
| 2005/0235263 | A1* | 10/2005 | Bundy | G06F 11/263 717/124 |
| 2005/0240372 | A1* | 10/2005 | Monk | H04L 43/00 702/122 |
| 2005/0240831 | A1* | 10/2005 | Balkman | G01R 1/025 714/46 |
| 2005/0253617 | A1* | 11/2005 | Roberts | G01R 31/319 324/756.02 |
| 2005/0261856 | A1* | 11/2005 | Kushnick | G01R 31/31907 702/117 |
| 2005/0268171 | A1* | 12/2005 | House | G06F 11/2273 714/32 |
| 2005/0278129 | A1* | 12/2005 | Benvenga | G06F 11/2247 702/68 |
| 2006/0074584 | A1* | 4/2006 | Giral | G01R 31/3016 702/119 |
| 2006/0150126 | A1* | 7/2006 | Kamannavar | G06F 17/5022 716/102 |
| 2006/0168183 | A1* | 7/2006 | Fuller, III | G05B 19/0426 709/223 |
| 2006/0174161 | A1* | 8/2006 | Sharma | G06F 11/2294 714/38.12 |
| 2006/0225034 | A1* | 10/2006 | Peck | G06F 8/34 717/106 |
| 2006/0282723 | A1* | 12/2006 | Pleasant | G01R 27/28 714/724 |
| 2007/0016394 | A1* | 1/2007 | Gaudette | G06F 11/261 703/19 |
| 2007/0118779 | A1* | 5/2007 | Wu | G01R 31/2834 714/725 |
| 2007/0124114 | A1* | 5/2007 | Shapiro | G06F 11/3672 702/186 |
| 2007/0168735 | A1* | 7/2007 | Lo | G06F 11/263 714/33 |
| 2007/0185682 | A1* | 8/2007 | Eidson | G01R 31/31922 702/178 |
| 2007/0226543 | A1* | 9/2007 | Young | G06F 11/2257 714/43 |
| 2007/0226555 | A1* | 9/2007 | Raines | G01R 31/318314 714/724 |

(56) References Cited

U.S. PATENT DOCUMENTS

| | | | |
|---|---|---|---|
| 2007/0230770 A1* | 10/2007 | Kulkarni | G06F 17/5045 382/149 |
| 2007/0234195 A1* | 10/2007 | Wells | G06F 17/30905 715/205 |
| 2008/0021669 A1* | 1/2008 | Blancha | G01R 31/2834 702/122 |
| 2008/0022264 A1* | 1/2008 | Macklem | G06F 8/34 717/136 |
| 2008/0030203 A1* | 2/2008 | Chung | G01R 31/2834 324/537 |
| 2008/0034297 A1* | 2/2008 | Correll | G06F 8/34 715/763 |
| 2008/0086668 A1 | 4/2008 | Jefferson | |
| 2008/0144656 A1* | 6/2008 | Frishberg | H04L 43/045 370/466 |
| 2008/0282212 A1* | 11/2008 | Dennison | G06F 17/5045 716/122 |
| 2009/0037132 A1* | 2/2009 | Zhou | G01R 31/31907 702/119 |
| 2009/0089619 A1* | 4/2009 | Huang | H04L 12/66 714/37 |
| 2009/0089715 A1* | 4/2009 | Dickey | G06F 8/34 715/853 |
| 2009/0100900 A1* | 4/2009 | Spalding | G01B 11/2504 73/1.81 |
| 2009/0163832 A1* | 6/2009 | Sunderani | G06F 19/3406 600/573 |
| 2009/0164931 A1* | 6/2009 | Kemmerling | G01R 31/2834 715/771 |
| 2009/0249121 A1* | 10/2009 | Kube | G06F 11/263 714/32 |
| 2009/0249297 A1* | 10/2009 | Doshi | G06F 11/3668 717/124 |
| 2010/0023294 A1* | 1/2010 | Fan | G01R 31/2834 702/123 |
| 2010/0075678 A1* | 3/2010 | Akman | H04W 24/06 455/436 |
| 2010/0077260 A1* | 3/2010 | Pillai | G06F 8/34 714/46 |
| 2010/0085894 A1* | 4/2010 | Johnson | H02G 3/00 370/254 |
| 2010/0111410 A1* | 5/2010 | Lu | G06F 3/1415 382/166 |
| 2010/0125667 A1* | 5/2010 | Soundararajan | H04L 63/0209 709/227 |
| 2010/0174697 A1* | 7/2010 | Mor-Barak | G06F 17/30902 707/705 |
| 2011/0001833 A1* | 1/2011 | Grinkemeyer | H04H 20/12 348/192 |
| 2011/0131000 A1* | 6/2011 | Daub | G01R 31/3191 702/118 |
| 2011/0160885 A1* | 6/2011 | Itskov | H04H 20/61 700/94 |
| 2011/0286506 A1* | 11/2011 | Libby | G01R 13/029 375/224 |
| 2011/0313942 A1* | 12/2011 | Higgins | G06Q 10/10 705/321 |
| 2011/0314333 A1* | 12/2011 | Olgaard | G06F 11/2294 714/27 |
| 2011/0320216 A1* | 12/2011 | Kasmark | G06F 3/015 705/2 |
| 2012/0065906 A1* | 3/2012 | Luce | G01R 31/316 702/57 |
| 2012/0089917 A1* | 4/2012 | Kwahk | G06F 3/0486 715/735 |
| 2012/0210179 A1* | 8/2012 | Xanthopoulos | G06F 11/27 714/718 |
| 2012/0249332 A1* | 10/2012 | Tezuka | A61B 5/746 340/573.1 |
| 2012/0278741 A1* | 11/2012 | Garrity | G06Q 10/10 715/760 |
| 2012/0284564 A1* | 11/2012 | Verma | G06F 11/2289 714/31 |
| 2012/0290920 A1* | 11/2012 | Crossley | G06F 11/3664 715/234 |
| 2013/0007710 A1* | 1/2013 | Vedula | G06F 9/5061 717/124 |
| 2013/0031514 A1* | 1/2013 | Gabbert | G06F 3/04883 715/863 |
| 2013/0054170 A1* | 2/2013 | Sobajic | G06F 11/2294 702/82 |
| 2013/0117019 A1* | 5/2013 | Akopian | G09B 5/00 704/235 |
| 2013/0127904 A1* | 5/2013 | Dove | G06F 3/0488 345/629 |
| 2013/0185093 A1* | 7/2013 | Wittliff, III | G16H 50/20 705/2 |
| 2013/0198429 A1* | 8/2013 | Chandhoke | G06F 13/372 710/244 |
| 2013/0218509 A1* | 8/2013 | Schroeder | G06F 11/263 702/123 |
| 2013/0247019 A1* | 9/2013 | Xu | G06F 17/5054 717/168 |
| 2013/0259097 A1* | 10/2013 | Olgaard | H04W 56/00 375/219 |
| 2013/0262015 A1 | 10/2013 | White | |
| 2013/0275337 A1* | 10/2013 | Gershon | G06Q 40/00 705/36 R |
| 2013/0282892 A1* | 10/2013 | Levi | H04L 43/50 709/224 |
| 2013/0289925 A1* | 10/2013 | Jiang | G06F 19/00 702/122 |
| 2013/0290938 A1* | 10/2013 | Nir | G06F 11/3672 717/130 |
| 2013/0297973 A1* | 11/2013 | Hyland | G06F 11/28 714/27 |
| 2013/0305088 A1* | 11/2013 | Xu | G06F 11/273 714/25 |
| 2013/0305091 A1* | 11/2013 | Stan | G06F 11/263 714/35 |
| 2013/0321092 A1* | 12/2013 | Simpson | H03H 11/30 333/17.3 |
| 2013/0338960 A1* | 12/2013 | Bourgault | G09G 5/377 702/122 |
| 2013/0339803 A1* | 12/2013 | Vandervalk | G06F 11/2733 714/45 |
| 2013/0345524 A1* | 12/2013 | Meyer | A61B 5/7271 600/301 |
| 2014/0019923 A1* | 1/2014 | Agarwala | G06F 17/5022 716/104 |
| 2014/0047417 A1* | 2/2014 | Kaasila | G06F 11/3664 717/135 |
| 2014/0093056 A1* | 4/2014 | Kawashima | H04M 3/5175 379/88.09 |
| 2014/0114528 A1* | 4/2014 | Marino | G07C 5/00 701/32.8 |
| 2014/0115394 A1* | 4/2014 | Fattah | G06F 11/26 714/32 |
| 2014/0123096 A1* | 5/2014 | Su | G06F 17/5045 716/136 |
| 2014/0130002 A1* | 5/2014 | AbdelAzim | G06F 17/5068 716/112 |
| 2014/0149811 A1* | 5/2014 | Ross | G01R 31/311 714/724 |
| 2014/0157050 A1* | 6/2014 | Zhao | G06F 11/263 714/28 |
| 2014/0173094 A1* | 6/2014 | Majumdar | H04L 43/028 709/224 |
| 2014/0177459 A1* | 6/2014 | Watt | H04L 41/0806 370/252 |
| 2014/0178845 A1* | 6/2014 | Riesberg | G09B 23/181 434/301 |
| 2014/0184648 A1* | 7/2014 | Claydon | G06F 3/14 345/649 |
| 2014/0256056 A1* | 9/2014 | Wang | G01F 25/0084 436/164 |

(56) References Cited

U.S. PATENT DOCUMENTS

| Publication No. | Date | Inventor | Classification | Subclass |
|---|---|---|---|---|
| 2014/0256373 A1* | 9/2014 | Hernandez | H04B 17/12 | 455/509 |
| 2014/0258781 A1* | 9/2014 | Cook | G06F 11/263 | 714/32 |
| 2014/0269386 A1* | 9/2014 | Chu | H04L 41/145 | 370/252 |
| 2014/0277607 A1* | 9/2014 | Nixon | G05B 11/01 | 700/66 |
| 2014/0280424 A1* | 9/2014 | Moyer | G06F 7/483 | 708/495 |
| 2014/0281721 A1* | 9/2014 | Navalur | G06F 11/3684 | 714/33 |
| 2014/0288911 A1* | 9/2014 | Chien | G06F 17/5036 | 703/14 |
| 2014/0294293 A1* | 10/2014 | Yamamura | G06K 9/6202 | 382/159 |
| 2014/0295771 A1* | 10/2014 | Finlow-Bates | H04W 24/06 | 455/67.14 |
| 2014/0321285 A1* | 10/2014 | Chew | H04L 47/24 | 370/236 |
| 2014/0331195 A1* | 11/2014 | Agarwala | G06F 17/5022 | 716/104 |
| 2014/0342333 A1* | 11/2014 | Knoche | G09B 5/02 | 434/267 |
| 2014/0344627 A1* | 11/2014 | Schaub | G06F 11/26 | 714/46 |
| 2014/0358514 A1* | 12/2014 | Liu | G06F 11/366 | 703/22 |
| 2014/0365826 A1* | 12/2014 | Liu | G06F 11/263 | 714/27 |
| 2014/0380278 A1* | 12/2014 | Dayan | G06F 11/3692 | 717/124 |
| 2015/0052500 A1* | 2/2015 | Herron | G06F 11/3684 | 717/124 |
| 2015/0058685 A1* | 2/2015 | Jang | G11C 29/16 | 714/719 |
| 2015/0066417 A1* | 3/2015 | Kimura | G11C 29/56 | 702/123 |
| 2015/0070041 A1* | 3/2015 | Song | G11C 29/56 | 324/756.02 |
| 2015/0106669 A1* | 4/2015 | Gintis | H04L 43/50 | 714/712 |
| 2015/0106670 A1* | 4/2015 | Gintis | H04L 43/045 | 714/712 |
| 2015/0133744 A1* | 5/2015 | Kobayashi | A61B 10/0012 | 600/301 |
| 2015/0234006 A1* | 8/2015 | Richards | G01R 31/308 | 324/756.02 |
| 2015/0249458 A1* | 9/2015 | Harrington | H03M 1/109 | 341/120 |
| 2015/0294342 A1* | 10/2015 | Hertel | G06Q 30/0226 | 705/14.27 |
| 2015/0331779 A1* | 11/2015 | Subramaniam | G06F 11/368 | 717/124 |
| 2015/0355274 A1* | 12/2015 | Ross | G01R 31/3177 | 324/754.23 |
| 2015/0365317 A1* | 12/2015 | Wang | G02B 6/268 | 398/16 |
| 2016/0057040 A1* | 2/2016 | Bergeron | H04L 43/04 | 370/252 |
| 2016/0081575 A1* | 3/2016 | Wu | G16H 50/30 | 600/301 |
| 2016/0103664 A1* | 4/2016 | Kee | G06F 8/34 | 717/105 |
| 2016/0111740 A1* | 4/2016 | Spaziante | G01R 31/3651 | 205/789.5 |
| 2016/0116528 A1* | 4/2016 | Narasaki | H01L 23/34 | 324/750.03 |
| 2016/0132202 A1* | 5/2016 | Hafizovic | G06F 3/002 | 715/762 |
| 2016/0182310 A1* | 6/2016 | Gintis | H04L 43/0811 | 370/248 |
| 2017/0235661 A1* | 8/2017 | Liu | G06F 11/368 | 717/106 |
| 2017/0249129 A1* | 8/2017 | McDaniel | G06F 8/34 | |

* cited by examiner

AUTOMATICALLY GENERATED TEST DIAGRAM

BACKGROUND

In an automated test system, a device to be tested (DUT) is connected to signal sources and measurement devices that are under the control of the test system. The DUT is typically tested for a number of different input conditions. The sources and measurement devices can be controlled from a computer via a local area network or some other form of communication channel. The computer defines the tests to be run by some form of script that causes the signal sources to sequence through the defined input sequences and the measurement devices to make the desired measurements.

SUMMARY

The present invention includes a method of operating a data processing system to generate a diagram indicative of an experimental setup which includes a DUT and a plurality of test instruments. The method includes detecting a first test instrument that is connected to the data processing system and determining connection points to the first test instrument. A script that specifies tests for the DUT using the plurality of test instruments and includes instructions specifying measurements to be made by the first test instrument is examined. A first connection between the DUT and the first test instrument is determined. A diagram on a display controlled by the data processing system is generated. The initial diagram includes a first node representing the first test instrument, a second node representing the DUT and a line representing the first connection between the first and second nodes.

In one aspect of the invention, the data processing system detects a second one of the plurality of test instruments and generates a third node on the diagram on the display representing the second one of the plurality of test instruments. The data processing system determines a connection between the second one of the plurality of test instruments from the script and generates a line connecting the third node to the DUT or one of the other test instruments representing the determined connection.

In another aspect of the invention, the data processing system generates a node representing each of the plurality of test instruments in the diagram on the display. In one embodiment, one of the plurality of test instruments is not detectable by the data processing system, and the data processing system is configured to receive input from a user of the data processing system defining the one of the plurality of instruments and connections that are available to that one of the plurality of test instruments.

In another aspect of the invention, the data processing system is configured to receive an instruction from a user of the data processing system, the instruction specifying a connection between two of the nodes on the display, the data processing system generating a line between the two of the nodes in the diagram on the display.

In a still further aspect of the invention, the data processing system is configured to receive user input specifying one of the nodes on the display, and the data processing system displays portions of the script that reference the test instrument corresponding to that node on the display.

In another aspect of the invention, the data processing system is configured to receive user input specifying a connection to one of the nodes on the display, and the data processing system displays portions of the script that reference the connection on the display.

In another aspect of the invention, the data processing system is configured to receive user input specifying a portion of the script that references one of the test instruments, and the data processing system displays highlights of the node representing that test instrument in the diagram.

In another aspect of the invention, the data processing system is configured to receive user input specifying a portion of the script that references a connection to one of the test instruments, and the data processing system displays highlights of the connection in the diagram.

In another aspect of the invention, the data processing system automatically removes nodes in the diagram that correspond to test instruments that are not referenced in the script.

DETAILED DESCRIPTION

Figure 1A:
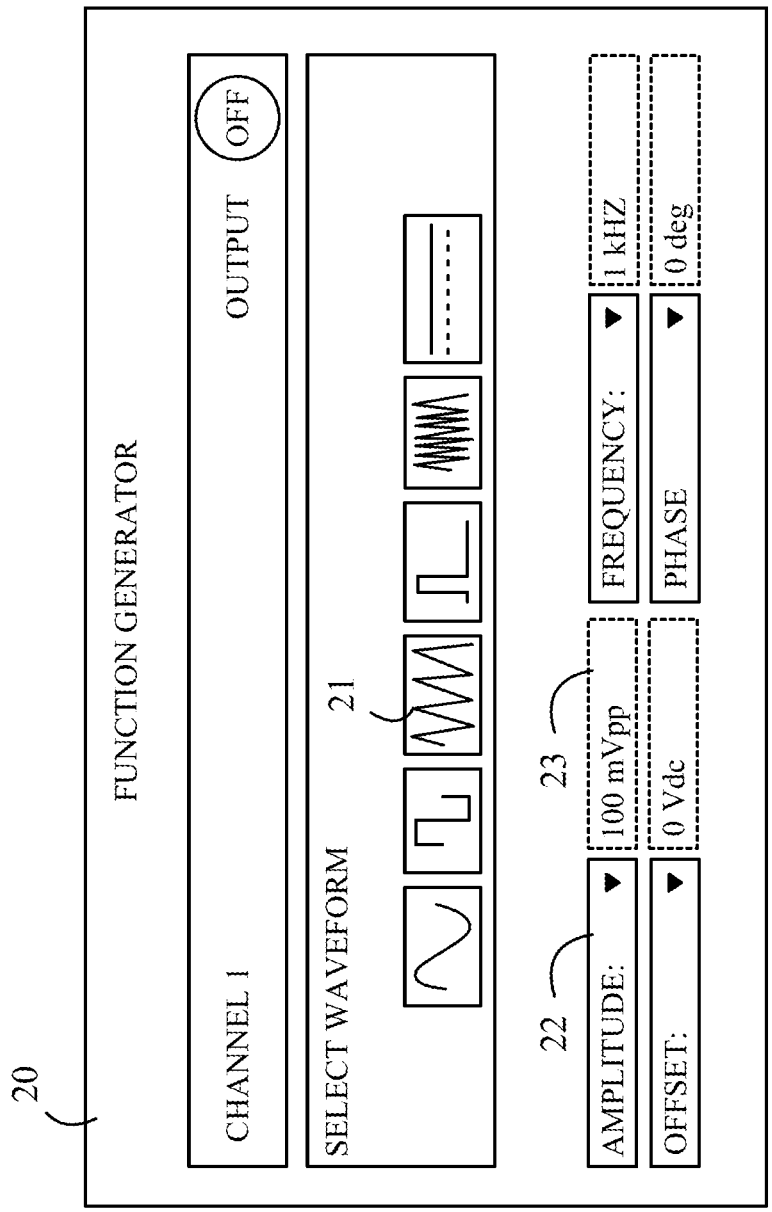
FIG. 1A illustrates a front panel representation of a function generator that might appear in a typical virtual bench top.

A test of the DUT is defined in terms of the topology of a circuit that includes the DUT. Even though measurements are defined in terms of a circuit configuration, most systems for automating electronic measurements fail to capture the circuit configuration information in the automation specification. A specification for a frequency response measurement, for example, would include sequences of commands to change frequency and amplitude inputs of a test signal and measure DUT outputs. Any information about the associated circuit configuration, such as how the DUT was actually connected to the signal sources and which DUT outputs were connected to the measurement device, is not captured in the script specifying the commands.

Hence, a user must maintain that information in some auxiliary format such as a laboratory notebook. This configuration information typically includes the details of the circuit showing how the components were connected to each other and which components were used. In addition, the association of the circuit configuration to the automation script must also be captured. The configuration record also needs to take into account variations in the script during development.

Requiring the user to maintain this information in a separate document is time consuming and error prone. Since a separate record is not essential to writing and debugging a script, a user may just keep this information in his or her head during the initial development of the script, and hence, the record will be lost when someone else decides to use the script in a new test.

Losing the association between a circuit configuration and an automation script may not be an insurmountable problem for experts, or for simple basic configurations. However, for less technical users or less typical configurations, losing the association between a circuit configuration and an automation script may cause the script to be unusable.

The present invention automatically generates a circuit diagram from the automation script and from information provided by the user. The circuit diagram is stored with the script. This has the advantage of relieving the user of the task of documenting the circuit topology. In addition, if the circuit diagram disagrees with the model the user had in mind when he or she wrote the script, the user will be alerted to possible errors in the script by inaccuracies in the generated diagram. The automatically generated circuit diagram can be edited by the user to provide comments and/or to provide connections that cannot be deduced from the script and a knowledge of the instruments attached to the computer running the method of the present invention.

In one aspect of the invention, a DUT diagram is a digital representation of a circuit configuration with a model and at least one view. The model needs to be able to represent the topology of an electrical circuit. In an exemplary embodiment, a graph is used as the model; however, other representations such as an adjacency matrix could also be used. In a graph, there will be one node for each instrument involved in the test and one node for the DUT. It is assumed that all of the relevant test instruments that are controlled by the script are controlled by the data processing system running the software. For example, if the present invention is part of a virtual bench top such as BenchVue by Keysight Technologies, Inc., the present invention will operate on the automation script in that application and the various instruments that are logged into the virtual bench top.

In some cases, a test instrument or power source may not be logged into the computer running the present invention. Devices that are part of the experimental setup, but not logged into the software of the present invention, will be referred to as uncontrolled devices. These devices are not controlled by the script. For example, in testing a battery-operated DUT during a battery run down test, the battery will typically not include the hardware and software needed to log into the computer. In addition, the script will not control the output of the battery.

In such cases, the present invention must acquire information about such devices from the user. The information must include the inputs and outputs of the non-logged device that are available for connection to the DUT or other instruments in the test setup. For common non-logged devices such as batteries, the information can be provided in the form of a device menu that is part of the present invention to reduce the work required to enter the relevant information. The user may still need to provide some information, such as the battery voltage even in non-logged devices that have preprogrammed menu items. In other cases, the user must provide all of the information.

The degree of detail for the nodes representing the instruments can vary from a simple box representing an instrument to a detailed view of the front panel of the instrument. In the case of a virtual bench top, representations of the instruments are available which represent the front panel of the instrument in a manner that allows the user to control the instrument as if the user were pushing buttons on the front panel of the actual instrument. Refer now to FIG. 1A, which illustrates a front panel representation of a function generator that might appear in a typical virtual bench top. Representation 20 includes a number of "buttons" for selecting the desired output waveform such as button 21. In addition, other properties of the output such as the amplitude, frequency, etc. can be set by typing values into the appropriate windows such as window 23 when amplitude is selected in window 22. The portion of the script dealing with the instrument may include the values corresponding to the waveform to be generated and the initial values of other parameters such as the phase of the output signal. These values are set once, and hence, are located in the initialization steps in the automation script.

Such detailed representations of the instruments can be useful for a user who must wire the actual instruments to the DUT in setting up the measurements. However, if the number of instruments in the setup is large, a less detailed representation may be preferred to allow the entire setup to be seen on a single display.

Figure 1B:
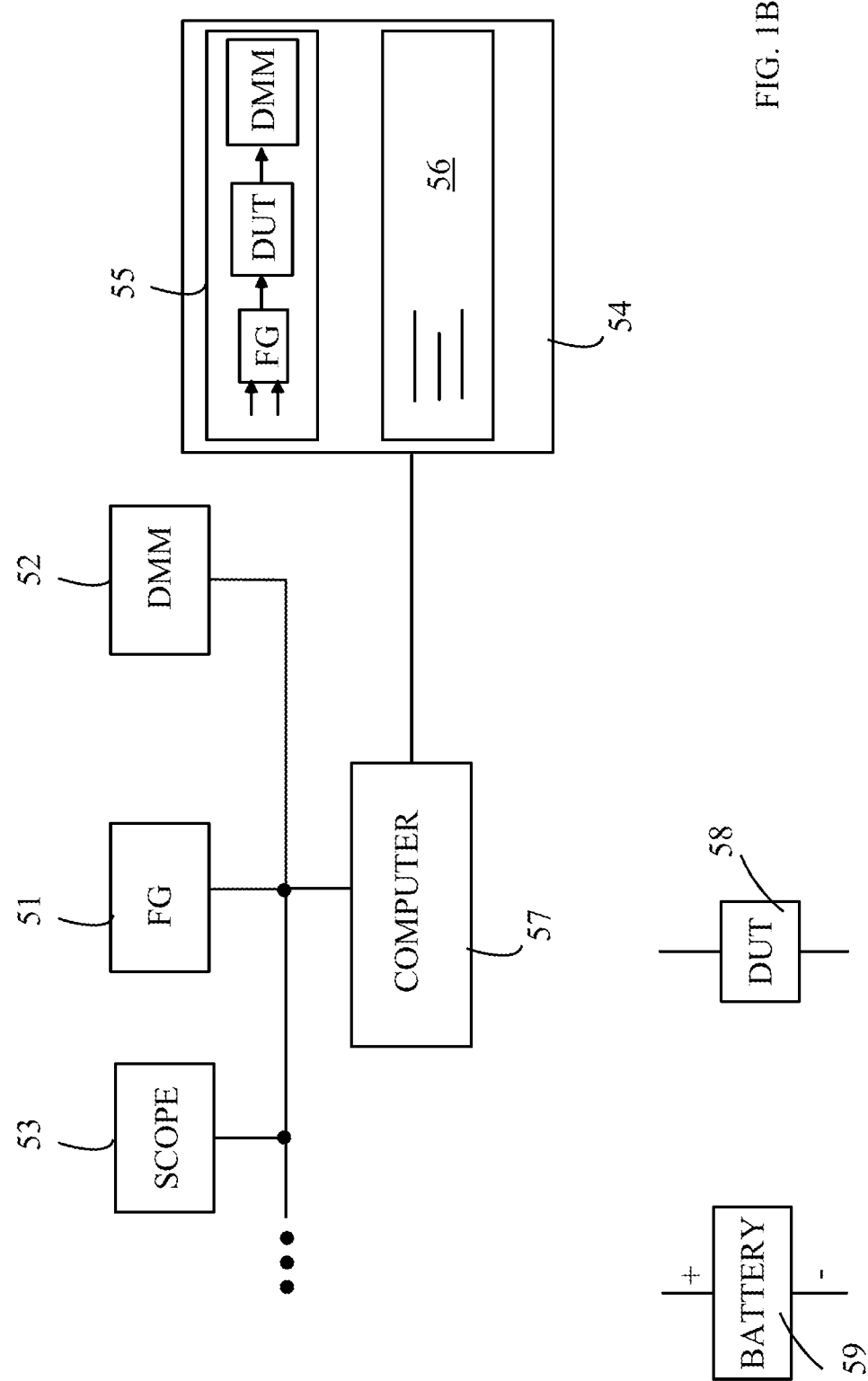
FIG. 1B illustrates one embodiment of a measurement system according to the present invention.

Refer now to FIG. 1B, which illustrates one embodiment of a measurement system according to the present invention. In general, there will be a number of physical instruments connected to a computer 57 which runs a program that executes the method of the present invention. Exemplary instruments are shown at 51-53. The instruments can be connected to computer 57 by any suitable communication path including a LAN, WAN, serial communication or wireless communication link. It should be noted that the DUT 58, in general, is not connected to computer 57. In addition, there may be other instruments or components that are used in the test, but are not connected to the computer, such as battery 59. Information about the DUT and non-connected instruments is supplied by the user in a manner that will be discussed in more detail below.

Computer 57 controls a display screen 54 which implements a graphical user interface (GUI) that is used to display and create a diagram 55 of the experimental setup and a script 56. Display screen 54 can be part of computer 57 or a separate component that is remotely located from computer 57. For example, the physical test instruments and the DUT may be located in a laboratory, while display screen 54 is located in the office of a test engineer who is actually running the test once the physical components are connected together.

Figure 2:
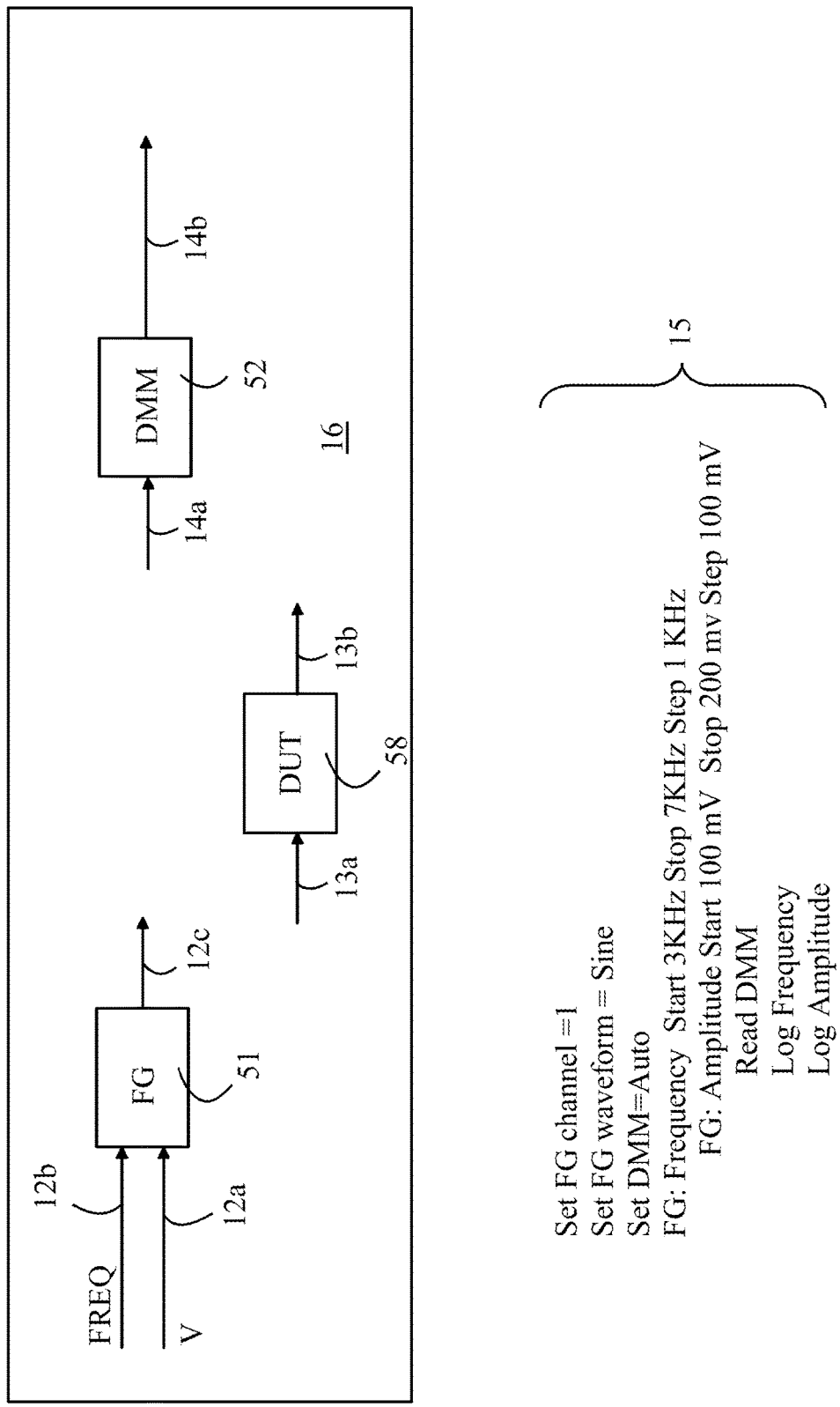
FIG. 2 illustrates the nodes of an initial drawing with the instruments represented by simple blocks.

Refer now to FIG. 2, which illustrates the nodes of an initial diagram with the instruments represented by simple blocks. In this example, DUT 58 is to be characterized by measuring the response of DUT 58 to an input signal that is varied in frequency and amplitude. The output of DUT 58 is measured using a digital multimeter (DMM) to measure the amplitude of the signal from DUT 58. The script that provides the automation of the measurements is shown at 15.

Script 15 sets up the function generator to use channel 1 and to generate a sine wave output. Script 15 also places the DMM in an automatic mode. Script 15 has two nested DO loops that vary the frequency and amplitude of the output of the function generator. For each combination of frequency and amplitude, the DMM is read and the frequency and amplitude of the function generator output is logged together with the DMM reading.

The data processing system detected a function generator 51 and a DMM 52 that are connected to the data processing system. In one aspect of the invention, if other instruments are connected to the data processing system but not referenced in the script, the additional instruments will not be shown in the initial diagram. Hence, since script 15 does not reference any other instruments, additional instruments that are connected to the data processing system do not give rise to additional nodes in the diagram. In other modes, the data processing system shows all instruments in the initial diagram, and the user removes the unwanted instruments.

In the present example, automation script 15 references a function generator 51 and a DMM 52. Hence, the data processing system places nodes corresponding to these instruments in diagram area 16. While function generator 51 has multiple channels, script 15 only refers to one channel. Hence, only one outbound edge 12c is provided in the diagram. Script 15 also references the frequency and amplitude of the signal from frequency generator 12. Hence, inbound edges 12a and 12b are provided.

Similarly, script 15 references DMM 52 which is also connected to the data processing system. In this simple example, it is assumed that DMM 52 has only one input and one output as shown at 14a and 14b. However, if the script referenced a DMM that had more than one input and output, the node for DMM 52 could have additional inputs and outputs, unless only one set was referenced in script 15.

Since the oscilloscope 53 shown in FIG. 2 is not referenced in the script, the initial diagram omits a node for oscilloscope 53, even though that instrument is connected to computer 57. In one aspect of the invention, the computer shows all connected instruments and provides a mechanism for the user to delete the instruments that are actually being used in the test.

Figure 3:
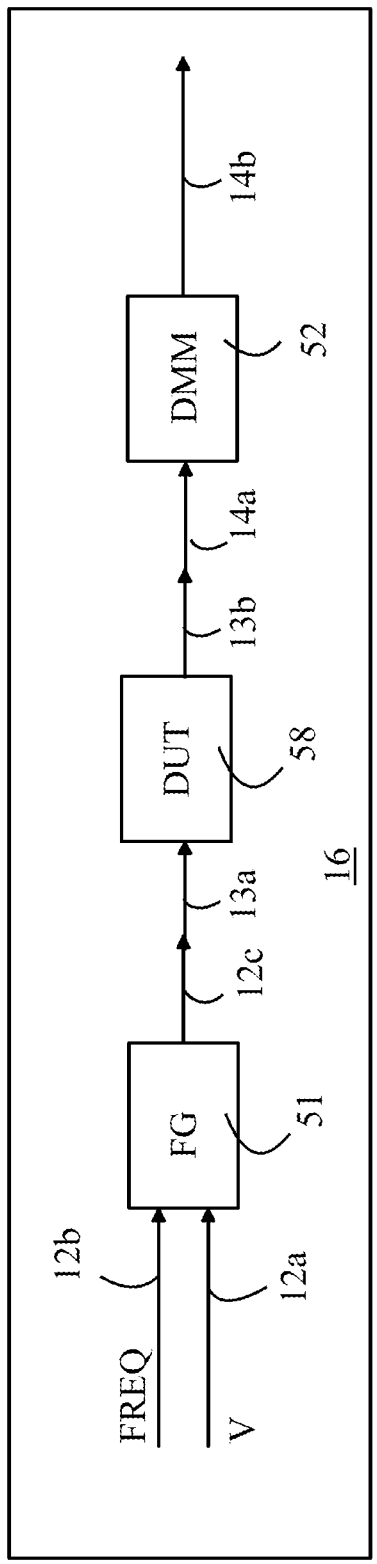
FIG. 3 illustrates the initial drawing corresponding to the script.

The data processing system assumes that DUT 58 has one input and one output shown at 13a and 13b, respectively. The initial diagram is generated by placing the node corresponding to the DUT in the center of the diagram. Nodes that give rise to output signals that can form the input signal to the DUT are placed on the left of DUT 58. Nodes that can act as a sink for the output signal from the DUT are placed on the right of DUT 58. In this example, there is only one source that is not matched, namely outbound edge 12c. Similarly, there is only a sink that lacks a connection, namely input 14a. Hence, the data processing system assumes that the diagram is as shown in FIG. 3, which illustrates the initial diagram corresponding to script 15.

Figure 4:
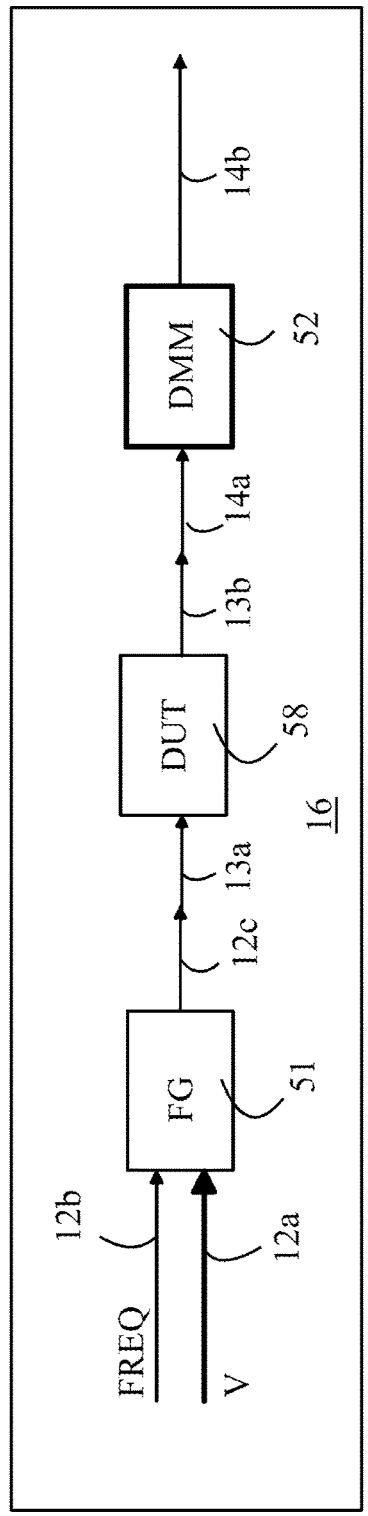
FIG. 4 illustrates the correspondence between the drawing and script.
Figure 4:
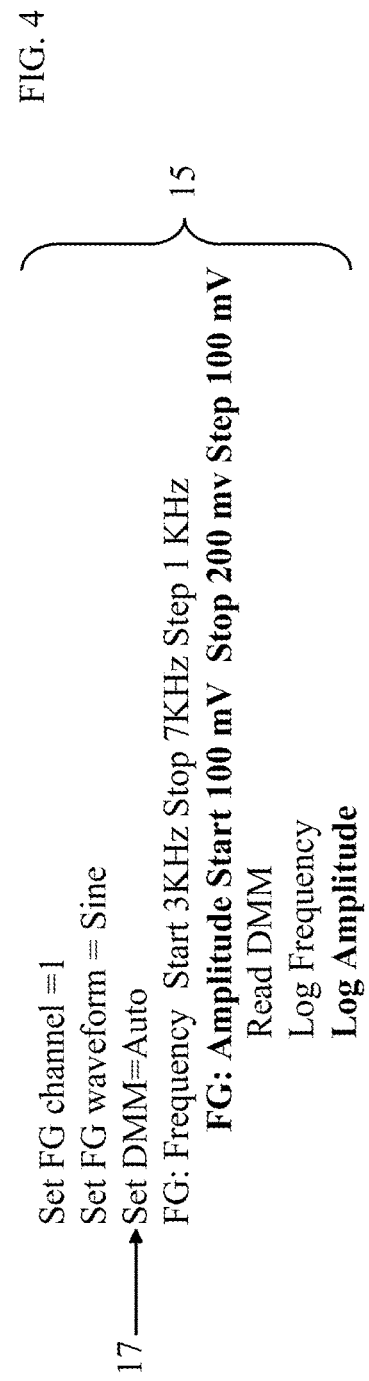

In one aspect of the present invention, a correspondence is maintained between the diagram and the script. If the user selects an element of the diagram, the location of the references to that element in the script are highlighted, and vice versa. Refer now to FIG. 4, which illustrates the correspondence between the diagram and script. If the user selects inbound edge 12a of function generator 51, the corresponding lines of code in the script are highlighted as shown by the bolded lines in script 15. Similarly, if the user selects a line of code in script 15 as shown at 17, the corresponding element is highlighted in diagram area 16 as shown by the highlighting of DMM 52.

In the above example, the data processing system can detect the instruments attached to it; however, it must be informed of the properties of those elements of the experimental setup that are not discernable from the drivers associated with those instruments or elements that are not so detectable, such as the DUT. In one aspect of the invention, the data processing system receives information from the user as to these other elements or other inputs and outputs that are not discernable from the drivers. The additional inputs and outputs are then shown on the initial diagram when appropriate.

In one aspect of the invention, the terminals corresponding to the inputs and outputs of the various instruments and other elements are classified as to whether the terminal is a source or a sink of a signal. If the instruments have drivers that are used by the data processing system and are recognized by the data processing system, this information is typically included in the information provided by the driver. In the case of elements that are not discernable from the drivers, the user supplies this information when the user inputs the information about the element in question. This arrangement reduces the number of possible connections that must be considered, since a source can only be connected to a sink, and a sink can only be connected to a source.

Figure 5:
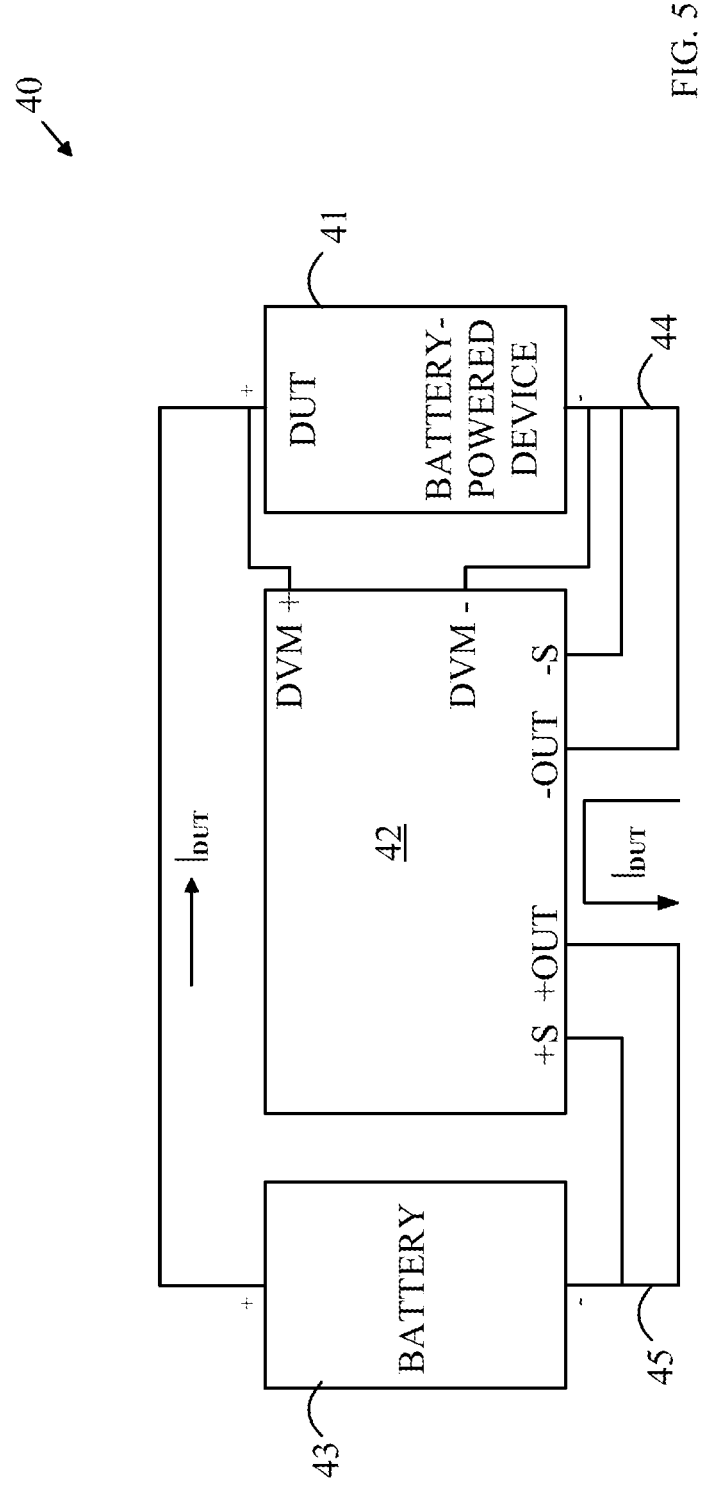
FIG. 5 illustrates an experimental setup for measuring the battery run-down performance of a battery-powered DUT using a specialized instrument, such as a Keysight Technologies N6781A.

In some cases, the data processing system will be unable to deduce all of the connections in the test circuit from the known instruments and the script. In this case, the present invention presents the user with the possible connections between terminals that are not unambiguously defined by the script. Refer now to FIG. 5, which illustrates an experimental setup 40 for measuring the battery run-down performance of a battery-powered DUT using a specialized instrument 42, such as a Keysight Technologies N6781A. Instrument 42 measures the voltage across DUT 41 and the current flowing through DUT 41 when DUT 41 is powered by battery 43. The voltage between outputs S+ and S− is maintained such that no voltage difference appears between terminals 44 and 45, and hence, eliminates any voltage drop resulting from the wiring. The current flowing between OUT+ and OUT− is measured by instrument 42 together with the voltage between DVM+ and DVM−.

The data processing system detects the presence of instrument 42. It is assumed that there is a simple script that repeatedly measures the voltage between DVM+ and DVM− and the current flowing through +OUT and −OUT. Since the instrument has a driver that specifies its inputs and outputs, instrument 42 knows which of the terminals in instrument 42 are sources and which are sinks. The data processing system also assumes that there is a DUT having a terminal that is a source and a terminal that is a sink. The presence of battery 43 is provided by user input. The user can pick the battery from a list displayed by the data processing system or enter the information specifying that element.

To aid the user, the data processing system can provide a list of additional common elements that are not directly connected to the data processing system, such as a battery. The inputs and outputs of these predefined, but not connected elements, are included in their definitions and stored in the data processing system. Alternatively, the user can supply the information directly by providing a name for the element and its inputs and outputs.

In the example shown in FIG. 5, the data processing system knows that a battery is present with a positive and a negative terminal. The data processing system also knows that DUT 41 had a positive and a negative terminal. The six terminals of instrument 42 are also known. The manner in which the various terminals are connected; however, is not clear, since the various measurements are all contained within instrument 42.

Figure 6:
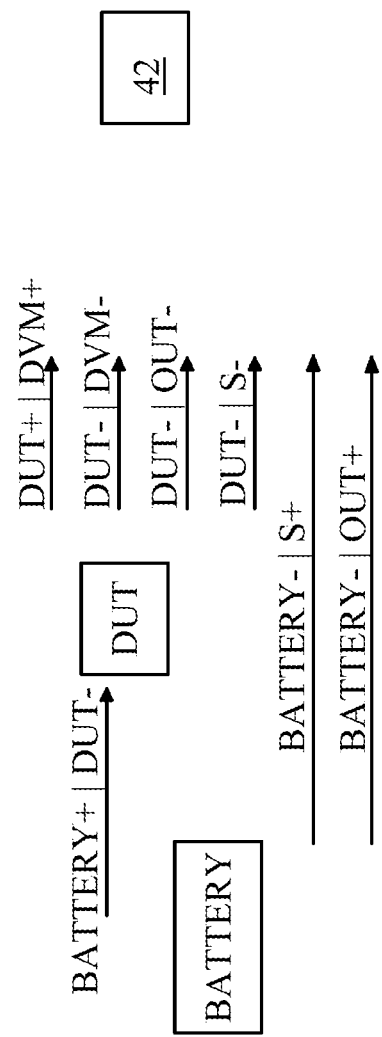
FIG. 6 illustrates an aspect of the present invention in which the user specifies the connections between the instruments.

Refer now to FIG. 6, which illustrates an aspect of the present invention in which the user specifies the connections between the instruments. In such a case, the data processing system can provide various possible connections in the diagram area, and the user can indicate the connections that are being used in the experimental setup. For example, the data processing system can provide a list of all possible terminals on instrument 42 and the two terminals on DUT 41. The user can then select a terminal from the DUT and a terminal from instrument 42 for connection. The process is repeated until the user has specified all of the desired connections.

In general, the specific implementation of the present invention will depend on the particular automation script language used by the virtual bench top or other test automation system. However, in general, the script will include statements that define the initial setup of each of the instruments being controlled. The script will also include statements that vary particular inputs and read particular outputs of the instruments during the test. Finally, the script will define where the data generated by the test is stored.

In general, there will be a driver representing each instrument that is currently logged into the virtual bench top. That driver will include information about the instrument, including the instrument's inputs and/or outputs. A signal output of an instrument is a "source", and a signal input of an instrument is a "sink" relative to the DUT. In addition, instruments such as power supplies or batteries can provide power outputs and inputs that are sources and sinks relative to power connections on the DUT. In such cases, the number of possible connections is reduced because a source must be connected to a sink.

In one aspect of the invention, the diagram engine is active while the script is being written or edited. In this case, the automatic deletion of instruments that are logged into the system running the present invention and that are not part of the script is suspended. In this aspect of the invention, new nodes are created automatically from new instruments referenced in the current script. For example, the first time the user references a property of a power supply, a node for the power supply will be inserted into the model and the diagram will be updated to show the new node.

The present invention can be implemented on any suitable data processing system including a conventional computer or special purpose hardware.

The present invention also includes a computer readable medium that stores instructions that cause a data processing system to execute the method of the present invention. A computer readable medium is defined to be any medium that constitutes patentable subject matter under 35 U.S.C. 101 and excludes any medium that does not constitute patentable subject matter under 35 U.S.C. 101. Examples of patentable media include non-transitory media such as computer memory devices that store information in a format that is readable by a computer or data processing system.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A self-documenting instrument test system comprising:
   a plurality of test instruments that perform a test specified by a script on a DUT when said DUT is connected to a circuit comprising connections between said DUT and said test instruments, said script specifying sequences of operations to be performed by said test instruments during said test, but not said connections between the test instruments and said DUT;
   a data processing system that operates each test instrument to determine any input and output connection points on said test instrument and any signal that can be generated by that test instrument and/or any signals that can be measured by that test instrument, said data processing system being adapted to examine said script and said information on said test instruments connected to said data processing system and to generate a circuit diagram showing said DUT and said test instruments in said script and connections between said DUT and said test instruments, said data processing system being adapted to display said circuit diagram on a GUI connected to said data processing system.

2. The system of claim 1 wherein said data processing system generates a node representing each of said plurality of test instruments in said diagram on said display.

3. The system of claim 2 wherein one of said plurality of test instruments is not detectable by said data processing system and wherein said data processing system is configured to receive input from a user of said data processing system defining said one of said plurality of test instruments and connections that are available to that one of said plurality of test instruments.

4. The system of claim 2 wherein said data processing system is configured to receive an instruction from a user of said data processing system, said instruction specifying a connection between two of said nodes on said display, said data processing system generating a line between said two of said nodes in said diagram on said display.

5. The system of claim 2 wherein said data processing system is configured to receive user input specifying one of said nodes on said display and wherein said data processing system displays portions of said script that reference said test instrument corresponding to said one of said nodes on said display.

6. The system of claim 2 wherein said data processing system is configured to receive user input specifying a connection to one of said nodes on said display and wherein said data processing system displays portions of said script that reference said connection on said display.

7. The system of claim 2 wherein said data processing system is configured to receive user input specifying a portion of said script that references one of said test instruments and wherein said data processing system highlights said node representing that test instrument in said diagram.

8. The system of claim 2 wherein said data processing system is configured to receive user input specifying a portion of said script that references a connection to one of said test instruments and wherein said data processing system highlights said connection in said diagram.

9. The system of claim 2 wherein said data processing system automatically removes nodes in said diagram that correspond to test instruments that are not referenced in said script.

10. A computer readable medium comprising instructions that cause a data processing system in an instrument test system comprising a plurality of test instruments connected to said data processing system in which said instrument test system performs a test on a DUT under the control of a script that does not provide the connections between said test instruments and said DUT to be converted to a self-documenting test system according to claim 1.

11. The computer readable medium of claim 10 wherein said data processing system generates a node representing each of said plurality of test instruments in said diagram on said display.

12. The computer readable medium of claim 11 wherein one of said plurality of test instruments is not detectable by said data processing system and wherein said data processing system is configured to receive input from a user of said data processing system defining said one of said plurality of test instruments and connections that are available to that one of said plurality of test instruments.

13. The computer readable medium of claim 11 wherein said data processing system is configured to receive an instruction from a user of said data processing system, said instruction specifying a connection between two of said nodes on said display, said data processing system generating a line between said two of said nodes in said diagram on said display.

14. The computer readable medium of claim 11 wherein said data processing system is configured to receive user input specifying one of said nodes on said display and wherein said data processing system displays portions of said script that reference said test instrument corresponding to said one of said nodes on said display.

15. The computer readable medium of claim 11 wherein said data processing system is configured to receive user input specifying a connection to one of said nodes on said display and wherein said data processing system displays portions of said script that reference said connection on said display.

16. The computer readable medium of claim 11 wherein said data processing system is configured to receive user input specifying a portion of said script that references one of said test instruments wherein said data processing system displays highlights of said node representing that test instrument in said diagram.

* * * * *